United States Patent
Ko et al.

(10) Patent No.: US 7,688,588 B2
(45) Date of Patent: Mar. 30, 2010

(54) HEAT DISSIPATION MODULE AND FAN THEREOF

(75) Inventors: Hao-Wen Ko, Taoyuan Hsien (TW); Tsung-Yu Lei, Taoyuan Hsien (TW); Wen-Shi Huang, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 97 days.

(21) Appl. No.: 11/902,902

(22) Filed: Sep. 26, 2007

(65) Prior Publication Data

US 2008/0084663 A1    Apr. 10, 2008

(30) Foreign Application Priority Data

Oct. 4, 2006    (TW) .............................. 95136868 A

(51) Int. Cl.
H05K 7/20    (2006.01)
F28F 3/02    (2006.01)
H01L 23/34    (2006.01)

(52) U.S. Cl. .................. 361/697; 165/121; 257/719; 361/694; 361/695; 361/719

(58) Field of Classification Search .......... 361/697, 361/700, 695, 719, 720; 415/177–178, 213.1, 415/211.2; 417/423.1, 423.14, 423.15
See application file for complete search history.

(56) References Cited

U.S. PATENT DOCUMENTS

| | | | | | |
|---|---|---|---|---|---|
| 5,421,402 | A | * | 6/1995 | Lin ........................... 165/80.3 |
| 5,582,506 | A | * | 12/1996 | Hong ......................... 415/177 |
| 5,835,347 | A | * | 11/1998 | Chu ........................... 361/697 |
| 6,017,185 | A | * | 1/2000 | Kuo ............................ 415/177 |
| 6,072,696 | A | * | 6/2000 | Horii ......................... 361/695 |
| 6,109,340 | A | * | 8/2000 | Nakase et al. ............... 165/80.3 |
| 6,688,379 | B2 | * | 2/2004 | Huang et al. ................ 165/121 |
| 7,057,897 | B2 | * | 6/2006 | Leu ............................ 361/704 |
| 7,200,934 | B2 | * | 4/2007 | Carter et al. ............. 29/890.03 |
| 7,390,172 | B2 | * | 6/2008 | Winkler ................ 417/423.15 |
| 2001/0040789 | A1 | * | 11/2001 | Tanaka et al. ............... 361/687 |
| 2003/0121645 | A1 | * | 7/2003 | Wang .................... 165/104.26 |
| 2007/0151712 | A1 | * | 7/2007 | Foster et al. ........... 165/104.33 |

* cited by examiner

*Primary Examiner*—Gregory D Thompson
(74) *Attorney, Agent, or Firm*—Birch, Stewart, Kolasch & Birch, LLP

(57) ABSTRACT

A heat dissipation module is disclosed. The heat dissipation module includes fan and at least a heat sink. The fan includes a frame and an impeller. The frame includes a body and at least an extension. The extension protrudes from at least a side of the body. The extension or the body is connected with the circuit board. The impeller is disposed in the body. The heat sink is connected with the extension for dissipating heat produced from the electronic element.

19 Claims, 7 Drawing Sheets

HEAT DISSIPATION MODULE AND FAN THEREOF

BACKGROUND OF THE INVENTION

1. Field of the Invention

The invention relates to a heat dissipation module and a fan thereof and more particularly, to a heat dissipation module and fan engaged with a circuit board by a fan frame.

2. Description of the Related Art

Electronic systems typically include heat dissipation modules for dissipating heat produced by electronic elements disposed on the circuit board of the electronic system. A conventional heat dissipation module can be separated into a heat sink and a fan, wherein the fan is fixed to the heat sink and the heat sink is fixed to the circuit board.

Because the heat sink and a base thereof for fixing the heat dissipation module to the circuit board are metal materials. Thus, the materials cost are high.

Another conventional heat dissipation module can be provided at less cost. This conventional heat dissipation module includes a support with a base, a fan, and a heat sink, each of which is an independent structure. The fan and the heat sink are respectively locked on the support. The heat dissipation module is fixed on the circuit board by the base of the support. The material of the support can be plastic rather than metal and thus, cost can be reduced because the support is an independent structure.

The adjustment and fabrications steps for the support and the fan, the support and the heat sink, and the fan and the heat sink are increased. Thus, the number of steps required to fabricate the entire heat dissipation module is increased and precision adjustment is required. The cost is additionally increased and the reliability and quality are decreased.

BRIEF SUMMARY OF THE INVENTION

Thus, to solve the described problems, the invention provides a heat dissipation module and a fan thereof with fewer elements and fabrication procedures, and reduced fabrication time and cost.

Accordingly, a heat dissipation module and a fan thereof are provided. The fan includes a frame and an impeller. The frame includes a body and at least an extension protruding from at least a side of the body. The extension or the body is connected to the circuit board. The impeller is disposed in the body. The heat sink is coupled to the extension for dissipating heat produced from the electronic element disposed on the circuit board.

Furthermore, a fan is provided. The fan includes a frame and an impeller. The frame includes a body and at least an extension protruding from at least a side of the body. The extension is connected to the circuit board. The impeller is disposed in the body.

The frame can be plastics, rubber, or polymer materials.

The heat sink includes at least a dissipating portion and at least a contact portion. The contact portion serves as a contact with the electronic element disposed on the circuit board. The extension includes at least an opening so that the contact portion can pass through the extension to be contacted with the electronic element. The dissipating portion can be a plurality of fins. The extension is coupled to the heat sink by clipping, engaging, locking, or receiving.

The body of the heat dissipation module or the fan is annular. The cross-sectional shape by the axial direction of the body is pillar, board-shape, L-shape, U-shape, O-shape or D-shape.

The extension and the body of the heat dissipation module or the fan respectively include at least a base for receiving at least a fastener. The fastener is utilized to fix the fan on the circuit board. The fastener is a screw, spring screw, bolt, or fastening structure.

The extension and the body of the heat dissipation module or the fan respectively include at least a connecting structure for connecting the fan with the circuit board. The connecting structure is a bolt, a fastening structure, a sliding structure, or a guiding structure.

The heat dissipation module or the fan further includes at least a fastener for fixing the fan on the circuit board.

The electronic element is a central processing unit or an integrated chip. The impeller includes at least a blade, and the shape thereof is flat, curved, or arced. The fan can also be a blower. The circuit board is a printed circuit board or laminated circuit board.

The heat dissipation module or the fan of the present invention, due to being directly connected to the fan frame with the circuit board, an additional support is not required. Thus, the number of elements, fabrication procedures, and required adjustment precision and cost are all decreased while improving reliability and quality. Additionally, the fan frame can be plastic material, and formed by injection-molding and thus, increasing production time, decreasing cost and increasing reliability and quality.

A detailed description is given in the following embodiments with reference to the accompanying drawings:

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
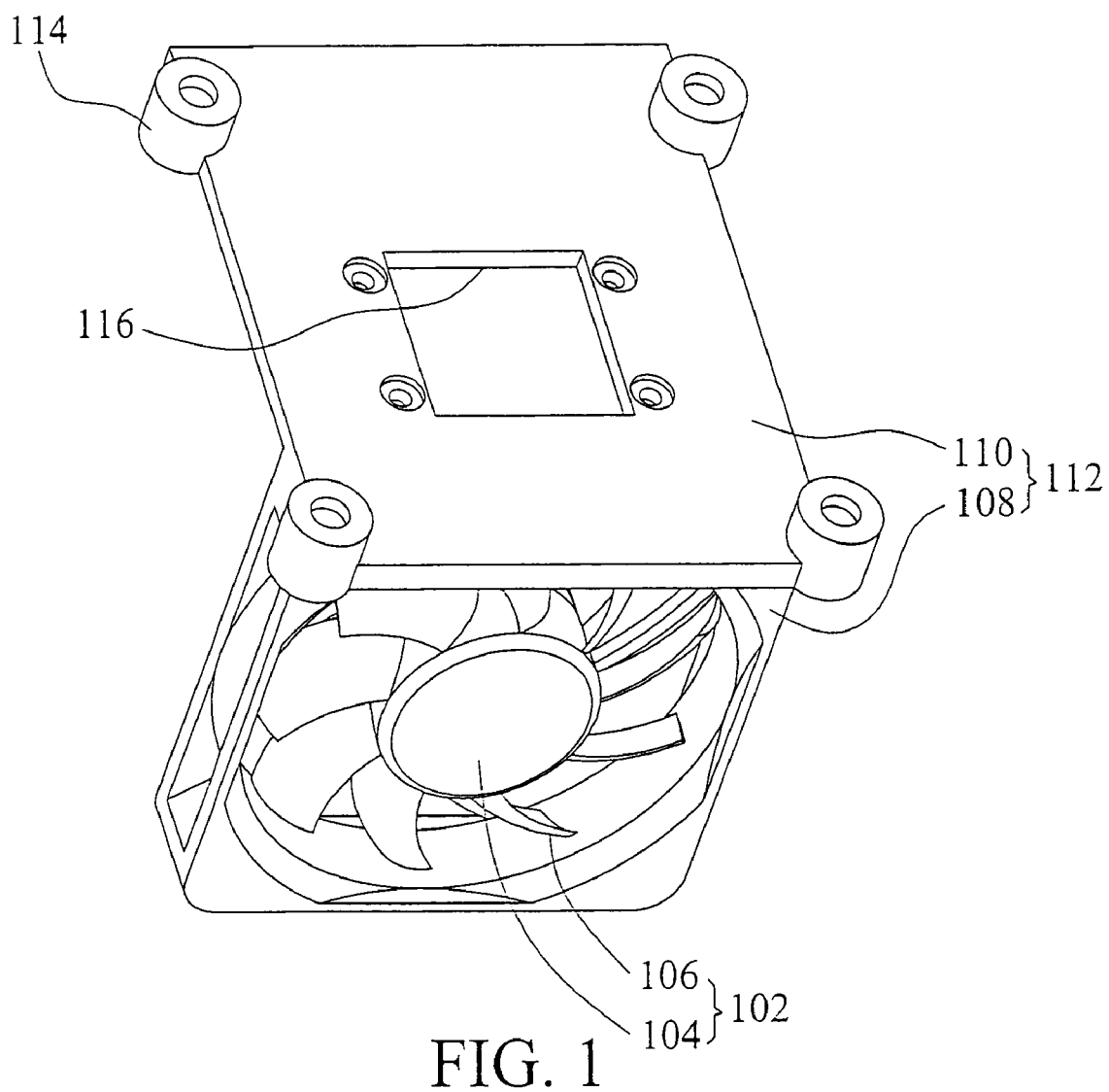
FIG. 1 is a schematic view of a first embodiment of a fan.

FIG. 1 is a schematic view of a first embodiment of a fan 100. Referring to FIG. 1, the fan 100 includes a frame 112 and an impeller 102. The frame 112 includes a body 108 and at least an extension 110 protruding from at least a side of the body 108. Particularly, the extension 110 protrudes in the axial direction from at least a side of the body 108.

The extension 110 or the body 108 is connected to a circuit board 208. The body 108 and the extension 110 are formed as a monolithic piece. Additionally, the frame 112 can be non-metal materials such as plastic, rubber, or polymer materials.

The body 108 can be annular. The sectional shape of the extension 110 extending in the axial direction of the body 108 is pillar, board-shape, L-shape, U-shape, O-shape or D-shape. In this embodiment, the sectional shape of the extension 110 extending in the axial direction of the body 108 is board shape.

Figure 2:
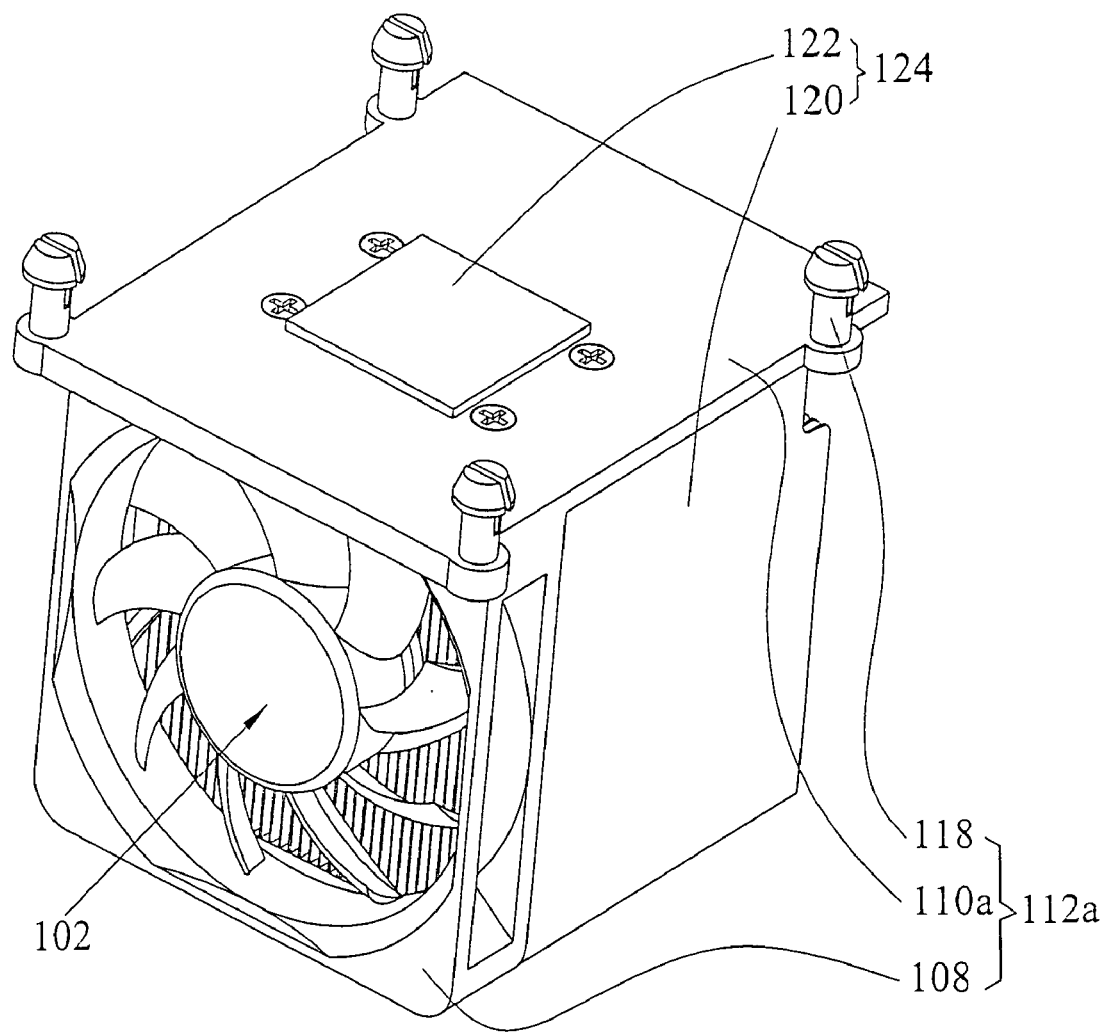
FIG. 2 is a schematic view of a first embodiment of a heat dissipation module.
Figure 5:
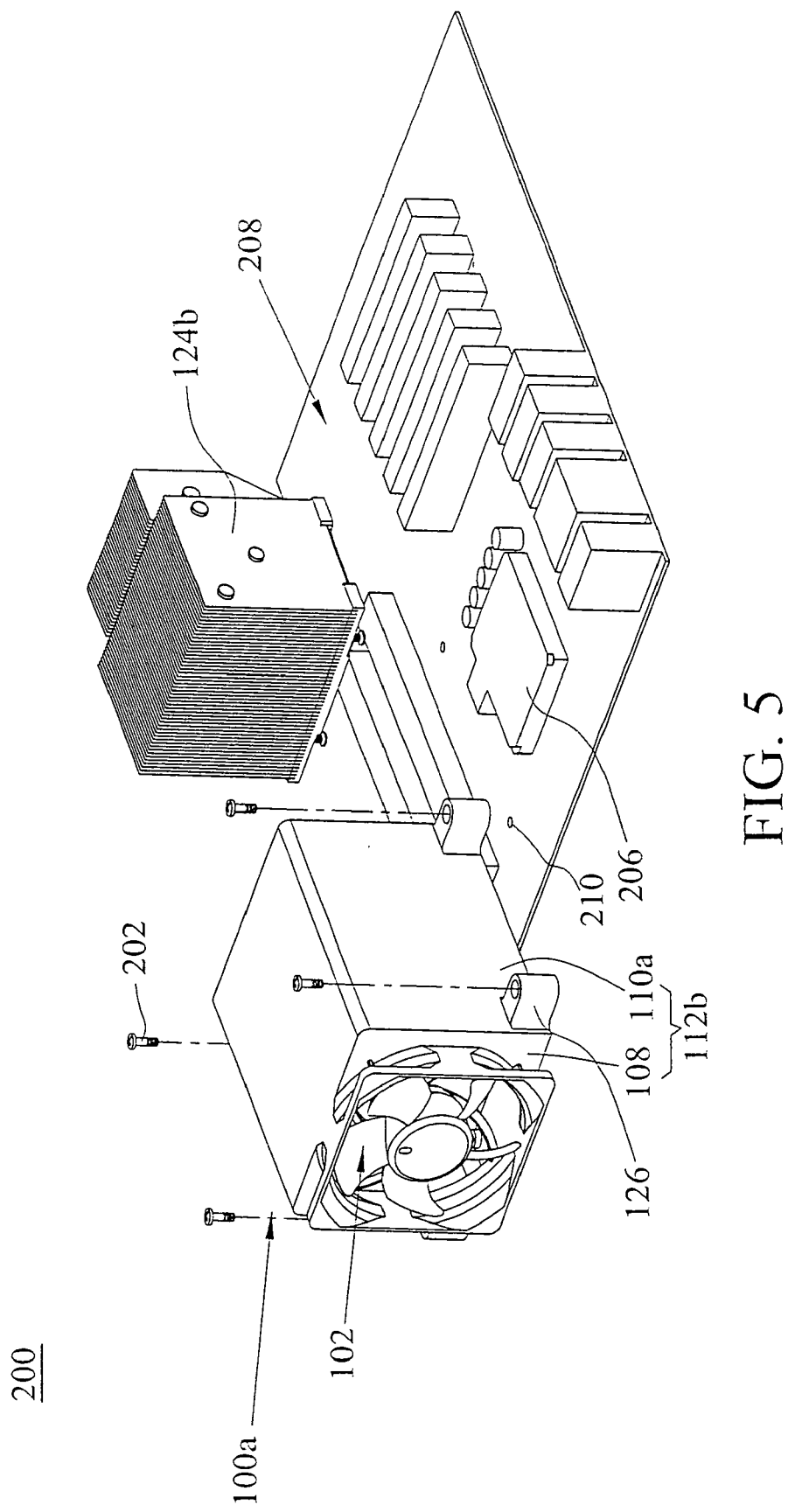
FIG. 5 is a schematic view of a first embodiment of a system.

The extension 110 includes at least an opening 116 so that a contact portion 122 of a heat sink 124 can pass through the extension 110 via the opening 116 and the contact portion 112 can contact with an electronic element 206 similar to the heat dissipation module 300 shown in FIG. 2. The extension 110 or the body 108 further includes a base 114 for receiving at least a fastener 202 as shown in FIG. 5. The fastener 202 serves to fix the fan 100 on a circuit board 208. The fastener 202 is a screw, a spring screw, a bolt, or a fastening structure.

The impeller 102 is disposed in the body 108. The impeller 102 includes a hub 104 and a plurality of blades 106 disposed around the hub 104. The fan 100 can be a blower. The shape of the blade 106 is flat, curved, or arced.

FIG. 2 is a schematic view of a first embodiment of a heat dissipation module 300. Referring to FIG. 2, the heat dissipation module 300 includes a fan and at least a heat sink 124. Different from FIG. 1, the extension 110a shown in FIG. 2 includes a connecting structure 118 substituting the base 114. A connecting structure 118, similar to the base 114 shown in FIG. 1, is a bolt, a fastening structure, a sliding structure, or a guiding structure. In this embodiment, the connecting structure 118 is a fastening bolt.

The heat sink 124 includes at least a dissipating portion 120 and at least a contact portion 122. The contact portion 122 contacts the electronic element 206. The heat sink 124 can be fins.

The heat sink 124 is coupled to the extension 110a for guiding heat produced from the electronic element 206 of the circuit board 208. The extension 110a is coupled to the heat sink 124 by clipping, engaging, locking, or receiving.

Figure 3:
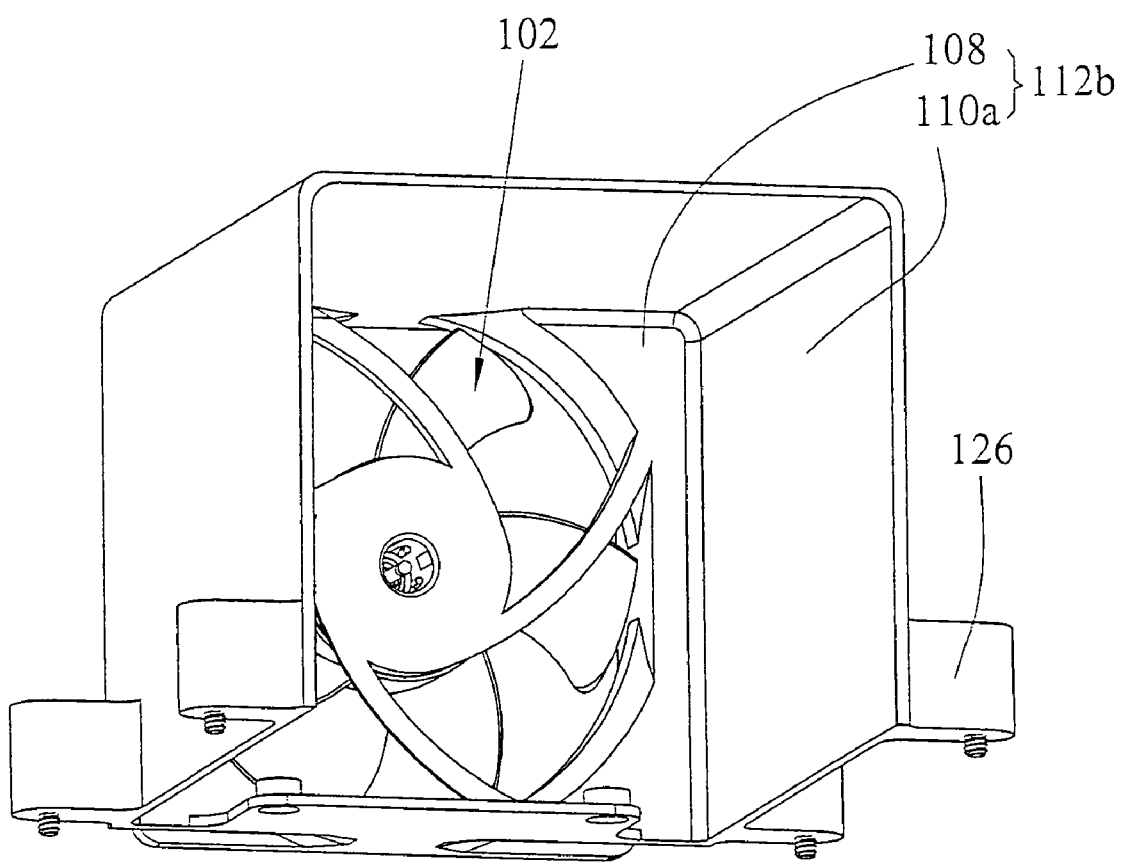
FIG. 3 is a schematic view of a second embodiment of a fan.

FIG. 3 is a schematic view of a second embodiment of a fan 100a. Referring to FIG. 3, the difference between the fan 100a and the preceding embodiments is the cross-sectional shape of the extension 110a of the frame 112b, wherein the sectional shape of the extension 110a toward an axial direction of the body 108 is U-shaped. Thus, the heat sink 124 is received in the extension 110a. The extension 110a is connected to the circuit board 208 by a base 126, which receives screws or spring screws therein.

Figure 4:
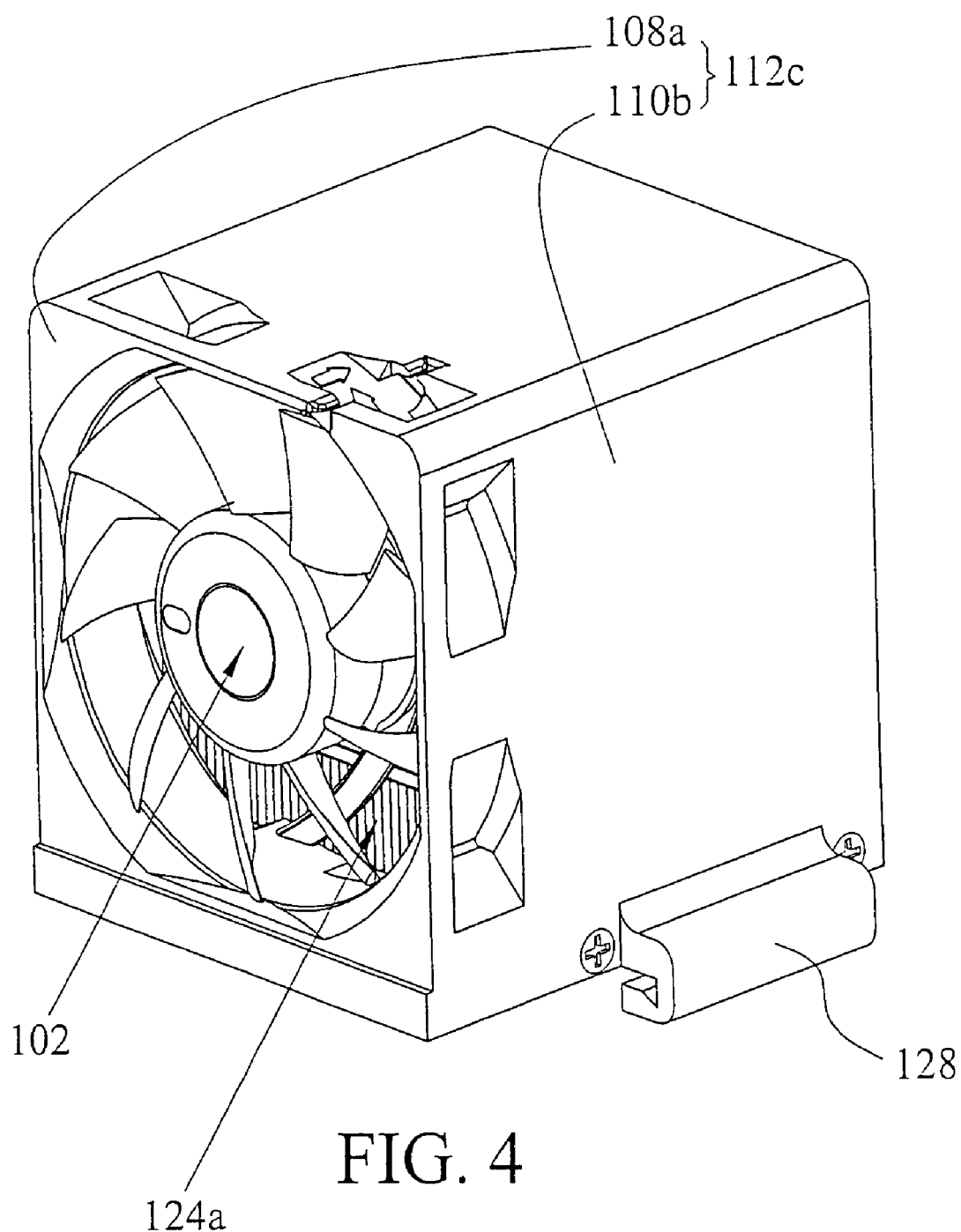
FIG. 4 is a schematic view of a second embodiment of a heat dissipation module.

FIG. 4 is a schematic view of a second embodiment of a heat dissipation module 300a. Referring to FIG. 4, a U-shaped extension 110b of a frame 112c conforms to the body 108a for aesthetic considerations. Additionally, the heat sink 124a is coupled to the extension 110b by side screwing. Thus, the extension 110b is a guiding-type connecting structure 128 for rapidly and securely connecting the heat dissipation module 300a and the circuit board 208.

For further describing the heat dissipation module or the fan, a general system is described. Referring to FIG. 5, a system 200 includes a circuit board 208 therein. The circuit board 208 includes at least an electronic element 206 and at least a fixed portion 210. The electronic element 206 can be a central processing unit or an integrated chip. The circuit board 208 can be a printed circuit board or a laminated circuit board.

Due to the excessive heat produced from the electronic element 206, the system 200 requires a heat dissipation module. At first, the heat sink 124b is disposed in the frame 112b and then, a base 126 is roughly aligned corresponding to the fixed portion 210. The fastener 202 passes through the base 126 and is screwed on the base 126. Thus, the heat sink 124b of the fan 100a is securely disposed on the electronic element 206. Thus, while the system is operating, the heat dissipation module 124b dissipates heat produced from the electronic element 206.

Because the frame 112b is not required to be in direct contact with the electronic element 206 in the system 200. Thus, the frame 112b does not require materials with high conductive coefficient, and can include non-metal materials such as plastic. Thus, the cost is decreased when compared with the conventional technology.

Figure 6:
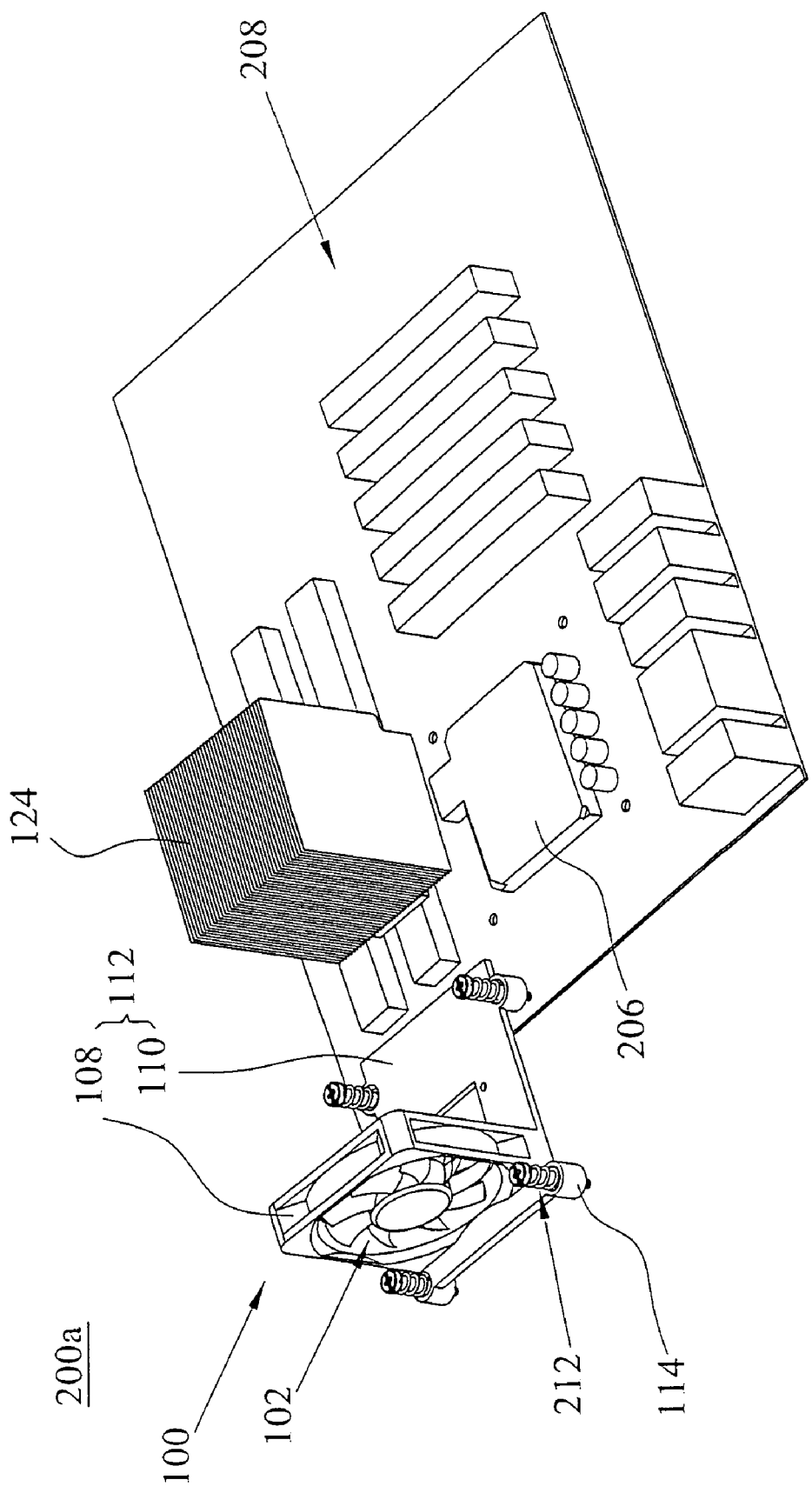
FIG. 6 is a schematic view of a second embodiment of a system.

Moreover, referring to FIG. 6, when a system 200a uses the fan 100 instead of the fan 100a, the fan 100 and the heat sink 124 are coupled to the extension 110 by screwing. The heat sink 124 is attached to the electronic element 206 via the contact portion of heat sink 124 passing through the opening of the extension 110. The spring screw 212 received in the base 114 fastens the fan 100 on the circuit board 208. A gap is formed between the extension 110 and the electronic element 206. Thus, the frame 112 can include non-metal materials, such as plastic, to reduce the cost to lower than that of the conventional. Furthermore, the extension 110 is board-shaped and the material of the extension 110 is less than that of the extension 110a so that the cost of the system 200a is less than that of the system 200.

Figure 7:
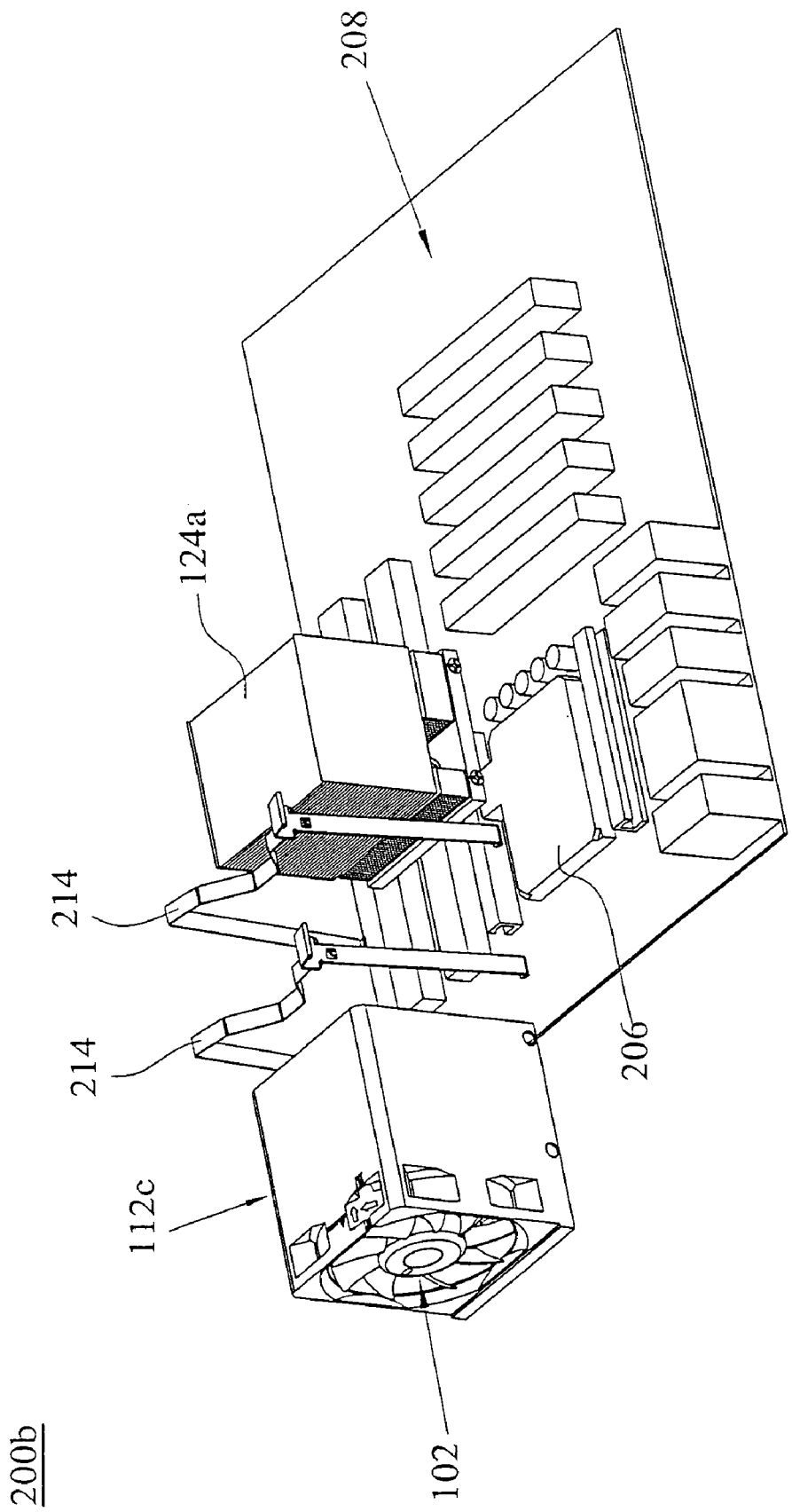
FIG. 7 is a schematic view of a third, embodiment of a system.

Referring to FIG. 7, the frame 112c is fixed on the circuit board 208 by a fastener 214. Thus, in system 200b, the frame 112c and the heat sink 124 can be attached to the circuit board 208 more rapidly, reducing production time.

As mentioned above, since the fan frame is directly connected to the circuit board, additional support is not required. Thus, the number of elements, fabrication, and adjustment procedures and cost are decreased while reliability and quality are improved. Additionally, the fan frame can include a plastic material. Thus, the fan frame can be formed by injection-molding, decreasing production time and increasing reliability and quality.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation module assembled with a circuit board, comprising:
    a fan comprising:
        a frame comprising a body and at least an extension, wherein the extension protrudes from at least a side of the body, and comprises an opening; and
        an impeller disposed in the body; and
    at least a heat sink coupled to the extension and comprising at least one contact portion, said at least one contact portion passing through the opening to be contacted with an electronic element for dissipating heat produced from the electronic element disposed on the circuit board.

2. The heat dissipation module as claimed in claim 1, wherein the cross-sectional shape of the body is pillared, board-shaped, L-shaped, U-shaped, O-shaped or D-shaped, and the extension protrudes from at least a side of the body along the axial direction.

3. The heat dissipation module as claimed in claim 1, wherein the heat sink comprises at least a dissipating portion.

4. The heat dissipation module as claimed in claim 1, wherein the extension or the body comprises at least a base for receiving at least a fastener to fix the fan on the circuit board.

5. The heat dissipation module as claimed in claim 1, wherein the extension or the body comprises at least a connecting structure for connecting the fan to the circuit board, wherein the connecting structure is a bolt, a fastening structure, a sliding structure, or a guiding structure.

6. The heat dissipation module as claimed in claim 1, further comprising at least a fastener for fixing the fan on the circuit board.

7. The heat dissipation module as claimed in claim 1, wherein the electronic element is a central processing unit or an integrated chip, and the circuit board is a printed circuit board or laminated circuit board.

8. The heat dissipation module as claimed in claim 1, wherein the impeller comprises at least a blade with a flat, curved, or arced shape.

9. The heat dissipation module as claimed in claim 1, wherein the extension is connected with the heat sink by clipping, engaging, locking, or receiving.

10. The heat dissipation module as claimed in claim 1, wherein the frame is made of non-metal materials, plastics, rubber, or polymer materials.

11. The heat dissipation module as claimed in claim 1, wherein the extension and the body are formed as a monolithic unit.

12. A fan comprising:
a frame comprising a body and at least an extension, wherein the extension protrudes from at least a side of the body, and comprises an opening for allowing a heat sink to pass through the opening to be contacted with a electronic element; and
an impeller disposed in the body,
wherein the extension or the body comprises at least a base for receiving at least a fastener used to fix the fan on a circuit board.

13. The fan as claimed in claim 12, wherein the cross-sectional shape of the extension is pillared, board-shaped, L-shaped, U-shaped, O-shaped or D-shaped.

14. The fan as claimed in claim 12, wherein the extension protrudes from at least the side of the body along an axial direction.

15. The fan as claimed in claim 12, wherein the extension or the body comprises at least a connecting structure for connecting the fan and a circuit board.

16. The fan as claimed in claim 15, wherein the connecting structure is a fast bolt, a fastening structure, a sliding structure, or a guiding structure.

17. The fan as claimed in claim 12, further comprising at least a fastener passing though the base for fixing the frame on a circuit board.

18. The fan as claimed in claim 12, wherein the frame is made of non-metal materials, plastics, rubber or polymer materials.

19. The heat dissipation module as claimed in claim 12, wherein the extension and the body are formed as a monolithic unit.

* * * * *